United States Patent
Chu et al.

(10) Patent No.: US 6,238,983 B1
(45) Date of Patent: May 29, 2001

(54) ALIGNMENT DIP BACK OXIDE AND CODE IMPLANT THROUGH POLY TO APPROACH THE DEPLETION MODE DEVICE CHARACTER

(75) Inventors: Cheng-Yu Chu, Hsin-Chu; Jenq-Dong Sheu, Chung-Ho; Dean E. Lin; Yi-Jing Chu, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/385,521

(22) Filed: Aug. 30, 1999

(51) Int. Cl.[7] ................................................. H01L 21/8246
(52) U.S. Cl. ............................................ 438/275; 438/278
(58) Field of Search ..................................... 438/275–278

(56) References Cited

U.S. PATENT DOCUMENTS

| 4,268,950 | 5/1981 | Chatterjee et al. | 29/571 |
| 4,467,520 | * 8/1984 | Shiotari . | |
| 5,350,703 | * 9/1994 | Lee . | |
| 5,449,632 | 9/1995 | Hong | 437/48 |
| 5,514,609 | 5/1996 | Chen et al. | 437/45 |
| 5,681,772 | 10/1997 | Chen et al. | 437/45 |
| 5,792,697 | 8/1998 | Wen | 438/275 |

OTHER PUBLICATIONS

S. Wolf, "Silicon Processing for the VLSI Era", vol. 2: Process Integration, Lattice Press, Sunset Beach, CA, ©1990, p. 619.

* cited by examiner

*Primary Examiner*—Jey Tsai
(74) *Attorney, Agent, or Firm*—George O. Saile; Stephen B. Ackerman

(57) ABSTRACT

A metal code process for a read-only memory (ROM) combines the alignment dip back process (to reduce the polyoxide thickness over the gate electrode and to protect the field oxide) with a double charge implant approach to provide the function of a depletion mode ROM cell. The alignment dip back process also avoids leakage current problems. A stable depletion mode device character is achieved by implant step energies greater than 150 keV.

7 Claims, 2 Drawing Sheets

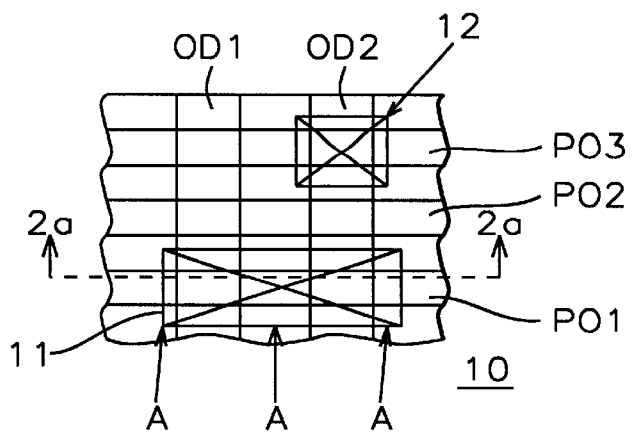
FIG. 1 – Prior Art
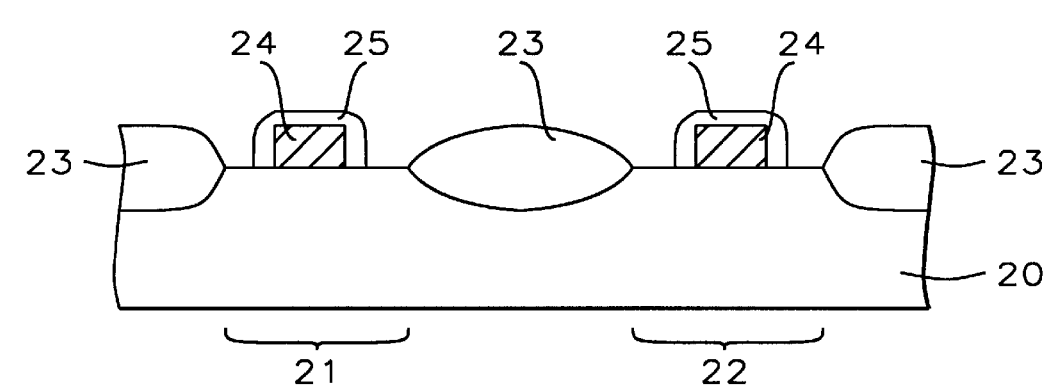
FIG. 2a – Prior Art
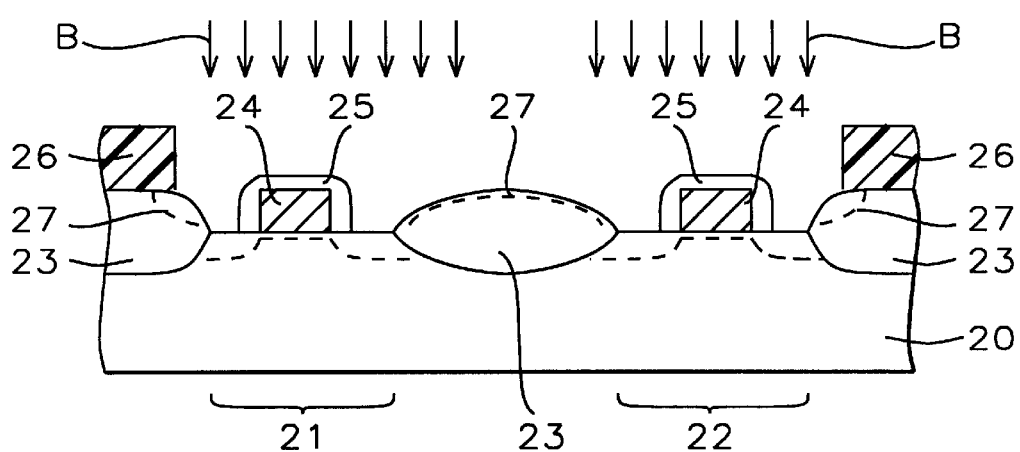
FIG. 2b – Prior Art

ALIGNMENT DIP BACK OXIDE AND CODE IMPLANT THROUGH POLY TO APPROACH THE DEPLETION MODE DEVICE CHARACTER

BACKGROUND OF THE INVENTION

1. Field of the Invention

The invention relates to a method of producing a semiconductor memory device, and more particularly to methods of producing a metal oxide semiconductor (MOS) read-only memory (ROM) device with shortened turn-around time.

2. Description of the Related Art

The fabrication of ROMs involves many process steps and ROMs are frequently made on special order, where the customer specifies the data that is to be stored or "implanted" in the ROM. In order to reduce the turn-around time (TAT) from when a customer places an order for ROMs to delivery, a manufacturer will prefabricate ROMs of certain storage capacities ahead of time and then store them (called banking). When a customer places an order, all the manufacturer now has to do is program the customer's data, by use of a mask, into the banked ROM and finish the chip. Therefore, the more processing steps can be done prior to banking, the fewer steps will be necessary afterwards and the less time it takes to deliver the chips. A description of masked ROMs is provided by S. Wolf in Silicon Processing for the VLSI Era, Volume 2—Process Integration, by Lattice Press, copyright 1990, Chapter 8.4, page 619.

Since the TAT is of significant economic impact and a factor in the competitiveness of a ROM supplier, there have been many proposals on how to shorten the TAT. In a typical process, called the implant code process, the code implant is done by converting selected transistors (the storage devices) of the ROM from enhancement to depletion mode devices, thereby turning the selected transistors on permanently. The unselected enhancement transistors can be viewed as storing logical "zeroes", while the depletion mode transistors can be viewed as storing logical "ones". The implant code process is usually through the sacrificial oxide (called SAC oxide) or the gate oxide of the selected transistors to transform the device cell from enhancement to depletion mode, however, shortening the cycle time is still an important economic goal.

FIG. 1 depicts a tiny portion a plan view of a prior art ROM memory 10, showing an array of active areas represented by OD1 and OD2 and of poly lines represented by PO1, PO2, and PO3 at right angles to the active areas. ROM cells are located at the intersection of active areas and poly lines. Depletion cell implant mask 11 extend over two cells and implant mask 12 extends over one cell. Arrows A indicate the area of the thinned field oxide and cell leakage. FIG. 2a is a cross section, taken along line 2a–2a of FIG. 1, before the dip back and implant profile step. Two cells 21 and 22 (on substrate 20) are shown separated by a field oxide (FOX) 23 having a thickness much greater than 6500 Åangstrom. Each cell is shown with a polysilicon gate 24 and oxide 25 with sidewall spacers. FIG. 2b illustrates the implant process step, depicted by arrows B, after the dip back step, i.e. the process of coding cells 21 and 22. The field oxide loss caused by the post buffered oxide etch is indicated by dashed lines 27 within field oxide 23. The field oxide loss causes a very undesirable cell leakage current. Photoresist 26 defines the area affected by the etchant, which equals the depletion cell implant mask 11 of FIG. 1.

To further improve the TAT, a change in the implant procedure from "through the SAC oxide" to "through the poly gate" is necessary by adding a dip back and etch back process to enlarge the implant process window and to get the depletion cell function. However, the dip back process impacts the field oxide thickness and increase the cell leakage current and final testing would see an increased yield loss. Additionally, the lower implant energy and implant depth are ineffective in achieving a stable depletion mode device.

The following U.S. Patents either relate to the manufacture of ROMs or to the problems discussed above:

U.S. Pat. No. 5,792,697 (Wen) discloses a method of forming a multi-stage ROM, replacing a multiple code implant.

U.S. Pat. No. 5,681,772 (Chen et al.) teaches the use of a recessed dielectric region overlying a gate electrode region. This method allows for an implanting step to occur after the dielectric layer is applied to surface of the device. Coding during a later processing step shortens product TAT.

U.S. Pat. No. 5,514,609 (Chen et al.) is similar to U.S. Pat. No. 5,681,772.

U.S. Pat. No. 5,449,632 (Hong) describes a method of producing a ROM where word lines are formed after the code implant step.

U.S. Pat. No. 4,268,950 (Chatterjee et al.) presents a method of programming a ROM either after the top level of device interconnects has been patterned and sintered or after the electrical testing of the devices. Selected transistors are programmed by implanting ions through their gates and gate oxides into the silicon.

It should be noted that none of the above cited examples of the related art are based on the metal code process which is disclosed subsequently.

SUMMARY OF THE INVENTION

It is an object of the present invention to provide a method of improving the turn-around-time of a ROM from time of received order to product delivery.

Another object of the present invention is to avoid field oxide loss and thus prevent leakage current problems.

A further object of the present invention is to provide a stable depletion mode device character for the ROM cell.

These objects have been achieved by combining the alignment dip back procedure (to reduce the polyoxide thickness over selected gate electrodes and to protect the field oxide) with the double charge implant, where the implant species has an absolute charge greater than one electron volt and where the implanting step is at an energy greater than 150 keV.

BRIEF DESCRIPTION OF THE DRAWINGS

FIG. 1 is a plan view of a portion of a ROM array of the prior art showing two active areas and three poly lines with six ceils at the intersections thereof.

FIGS. 2a and 2b are cross-sectional views of FIG. 1, taken along line 2a–2a at different stages of the process.

DESCRIPTION OF THE PREFERRED EMBODIMENT

In the preferred embodiment of the present invention, the metal code process, the turn-around time (TAT) for customizing a ROM can be reduced by using an aligned dip back to remove the polyoxide and to protect the field oxide (FOX). The aligned dip back process also eliminates the problem of leakage current because there is no loss of the field oxide which is otherwise unavoidable when using a buffered oxide etchant. The combined oxide dip back procedure and the double charge implant convert an enhancement mode transistor into an depletion mode transistor. A selected ROM cell thus acts as a depletion mode transistor. This method shortens the TAT by combining the oxide dip back procedure and the double charge implant.

We begin a description of the method of providing a code implant using an alignment dip back and a code implant through polyoxide to provide a depletion mode device for a read-only memory (ROM). The process entails:

banking the wafer after $P^+$ (phosphorus) source and drain implant and before chemical vapor deposition (CVD) oxide growth (as borophosphosilicate glass [BPSG] and contact dielectric oxide), wait for the customer code number and order, polyoxide dip back and code implant.

Figure 3:
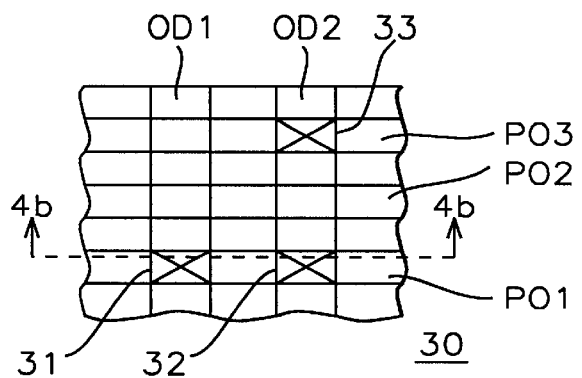
FIG. 3 is a plan view of a portion of a ROM array according to an embodiment of the present invention showing two active areas and three poly lines with six cells at the intersections thereof.

FIG. 3 depicts a tiny portion a plan view of the present invention ROM memory 30, showing an array of active areas represented by OD1 and OD2 and of poly lines represented by PO1, PO2, and PO3 at right angles to the active areas. At the crossing of poly lines and active areas are the sites of ROM memory cells, six in this example. Each cell corresponds to a region for storing a bit of information. Where poly line PO1 crosses OD1 and OD2 are cells 31 and 32 which will be coded, i.e. represent a logical one. This is by way of example and coding of a cell could equally well represent a logical zero. One more cell 33 at the intersection of poly line PO3 and active area OD2 will be coded for a logical one. The remaining three cells will not be coded and, therefore, represent logical zeros.

Figure 4:
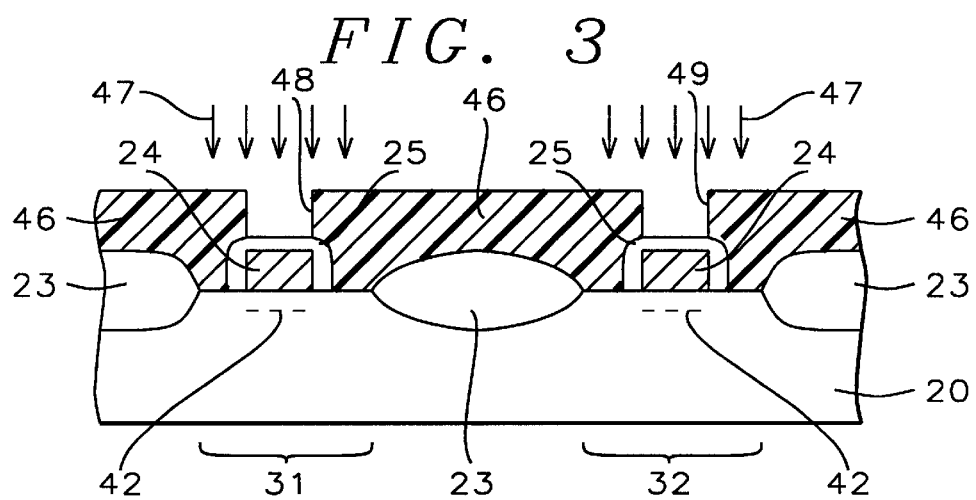
FIG. 4 is a cross-sectional view of FIG. 3 along line 4—4.

FIG. 4 is a cross section taken along line 4—4 of FIG. 3 of two ROM cells 31 and 32 on substrate 20, during the implant step, i.e. the process of coding cells 31 and 32. Cells 31 and 32 are shown separated by field oxide (FOX) 23, having a thickness much greater than 6500 Ångstrom. Each cell is shown with a polysilicon gate 24 and polyoxide 25 with sidewall spacers. Photoresist 46 defines the area affected by the buffered oxide etchant (BOE). The implant, shown by arrows 47, is confined by photoresist 46 to openings 48 and 49 over each gate. The effect of the implant below each gate is indicated by the dashed line 42.

Figure 5A:
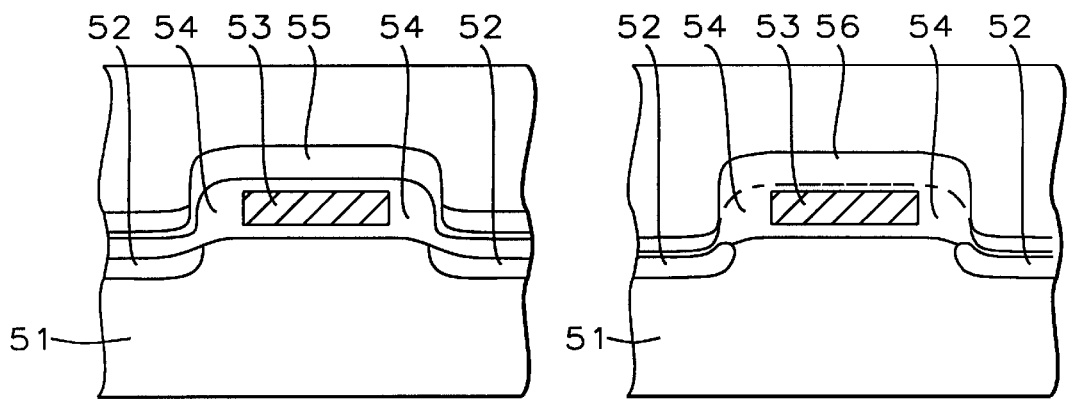
FIGS. 5a and 5b are redrawn micrographs of the cross-sectional view of one cell along section 4—4 of FIG. 3 before and after the dip back, respectively.
Figure 5B:
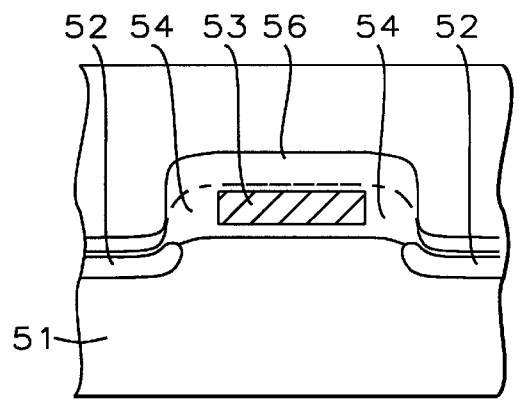

FIG. 5a is a micrograph of a cell poly profile (similar to cell 31 or 32) before the dip back. Shown is a substrate 51, source and drain 52, the polysilicon gate 53 with spacers 54, and a thicker polyoxide 55 on top of polysilicon gate 53. FIG. 5b is the cell poly profile after the dip back. The thinner polyoxide layer 56 is clearly visible and improves the implant process window.

The method of the preferred embodiment calls for providing on a semiconductor wafer partially completed semiconductor devices each with at least a gate electrode, a channel region, and a source and drain. A field oxide (FOX) with a thickness much greater than 6500 Ångstrom separates the active areas. A borophosphosilicate glass polyoxide layer is grown next, overlying the gate electrodes using chemical vapor deposition (CVD) means. This is followed by implanting the source and drain with $P^+$ (phosphorus) impurities. Next comes growing dielectric oxide to contact the source and drain through CVD. The method continues with applying a photoresist masking selected gate electrodes. The photoresist is then exposed and developed leaving openings only over the polysilicon of the selected gate electrodes. The gate electrode may also be a silicide gate, polycide gate, or the combination thereof. By dipping the wafer into a buffered oxide etchant, first the dielectric oxide and then the polyoxide are etched back, leaving a remaining thickness of the polyoxide over selected gate electrodes. The remaining thickness of the polyoxide is typically 300 Ångstrom, but may range from 200 to 500 Ångstrom. By providing only an opening over the selected gate electrodes the field oxide is protected and leakage currents are avoided. The last step is implanting code information relating to a logical zero or one into the remaining thickness of the polyoxide.

The metal being implanted has an absolute charge greater than one electron volt, and requires an energy greater than 150 keV. The metal is implanted in the remaining thickness of the polyoxide and in the channel below the gate, the latter turning the cell into a depletion mode transistor. The polyoxide thus provides a conductive channel above the gate extending from source to drain such that this conductive channel contributes to the conduction of the depletion mode transistor.

The preferred method of the present invention provides improved TAT by combining the oxide dip back procedure with the double charge implant approach to the depletion mode ROM cell and fixes the leakage current problem by the alignment dip back process.

While the invention has been particularly shown and described with reference to the preferred embodiments thereof, it will be understood by those skilled in the art that various changes in form and details may be made without departing from the spirit and scope of the invention.

What is claimed is:

1. A method of providing a code implant for a read-only memory (ROM), comprising the steps of:

providing on a semiconductor wafer partially completed semiconductor devices each with at least a gate electrode, a channel region, and a source and a drain;

forming a polyoxide layer overlying said gate electrodes;

dipping back said polyoxide layer over selected gate electrodes, where said polyoxide layer after dip back ranges from 200 to 500 Ångstrom to improve the implant process window;

double charge implanting code information into said polyoxide layer over said selected gate electrodes, said polyoxide thus providing a conductive channel extending from said source to said drain; and double charge implanting code information below said selected gate electrodes thereby converting an enhancement mode transistor to a depletion mode transistor.

2. The method of claim 1, wherein said implanting of said code information has an absolute charge greater than one electron volt.

3. The method of claim 1, wherein said implanting of said code information is at an energy greater than 150 kev.

4. The method of claim 1, wherein said polyoxide layer is a BPSG layer.

5. A method of providing a code implant for a read-only memory (ROM), comprising the steps of:

providing on a semiconductor wafer partially completed semiconductor devices each with at least a gate electrode, a channel region, and a source and a drain;

growing a polyoxide layer overlying said gate electrodes using chemical vapor deposition (CVD) means;

implanting said source and said drain with $P^+$ (phosphorus) impurities;

growing dielectric oxide to contact said source and said drain through CVD;

masking selected gate electrodes;

dipping back said dielectric oxide and said polyoxide, leaving a remaining thickness, ranging from 200 to 500 Ångstrom, of said polyoxide over said selected gate electrodes to improve the implant process window;

double charge implanting code information, relating to storing data in said ROM, into said remaining thickness of said polyoxide, said polyoxide providing thus a conductive channel extending from said source to said drain; and double charge implanting code information below said selected gate electrodes thereby converting an enhancement mode transistor to a depletion mode transistor.

6. The method of claim 5, wherein said metal being implanted has an absolute charge greater than one electron volt.

7. The method of claim 5, wherein said implanting of said metal is at an energy greater than 150 keV.

* * * * *